(12) United States Patent
Szwarc et al.

(10) Patent No.: US 7,965,169 B2
(45) Date of Patent: Jun. 21, 2011

(54) SURFACE MOUNTED CHIP RESISTOR WITH FLEXIBLE LEADS

(76) Inventors: Joseph Szwarc, Ramat Gan (IL); Dany Mazliah, Holon (IL); Makio Sato, Akita-Prefecture (JP); Toru Okamoto, Akita-Prefecture (JP)

( * ) Notice: Subject to any disclaimer, the term of this patent is extended or adjusted under 35 U.S.C. 154(b) by 613 days.

(21) Appl. No.: 12/035,472

(22) Filed: Feb. 22, 2008

(65) Prior Publication Data

US 2009/0212900 A1    Aug. 27, 2009

(51) Int. Cl.
*H01C 7/10* (2006.01)
(52) U.S. Cl. ........ 338/22 R; 338/307; 338/320; 338/332
(58) Field of Classification Search .......... 338/320, 338/195, 307–309, 313, 327, 332
See application file for complete search history.

(56) References Cited

U.S. PATENT DOCUMENTS

| | | | | |
|---|---|---|---|---|
| 5,258,738 A | * | 11/1993 | Schat | 338/332 |
| 5,680,092 A | * | 10/1997 | Yamada et al. | 338/309 |
| 5,907,274 A | * | 5/1999 | Kimura et al. | 338/309 |
| 6,903,920 B1 | | 6/2005 | Prymak | |
| 2004/0041688 A1 | * | 3/2004 | Akhtman et al. | 338/309 |

FOREIGN PATENT DOCUMENTS

| | | |
|---|---|---|
| DE | 31 17 973 A1 | 11/1982 |
| EP | 0 829 886 A2 | 3/1998 |

OTHER PUBLICATIONS

International Search Report, Vishay Intertechnology, Inc., PCT/US2008/054648, Jan. 21, 2009, 4 pages.

* cited by examiner

*Primary Examiner* — Kyung Lee
(74) *Attorney, Agent, or Firm* — Volpe and Koenig, P.C.

(57) ABSTRACT

A chip resistor having first and second opposite ends includes a rigid insulated substrate having a top surface and an opposite bottom surface, a first electrically conductive termination pad and a second electrically conductive termination pad, both termination pads on the top surface of the rigid insulated substrate, a layer of resistive material between the first and second electrically conductive termination pads, and a first and a second flexible lead, each made of an electrically conductive metal with a solder enhancing coating. The first flexible lead attached and electrically connected to the first electrically conductive termination pad and the second flexible lead attached and electrically connected to the second electrically conductive termination pad. Each of the flexible leads has a plurality of lead sections facilitating bending around the end of the chip resistor.

20 Claims, 4 Drawing Sheets

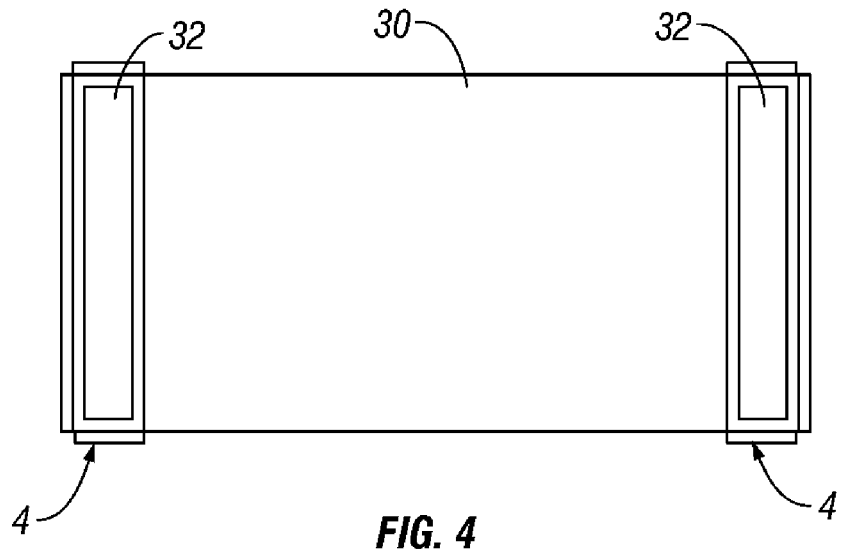
FIG. 4
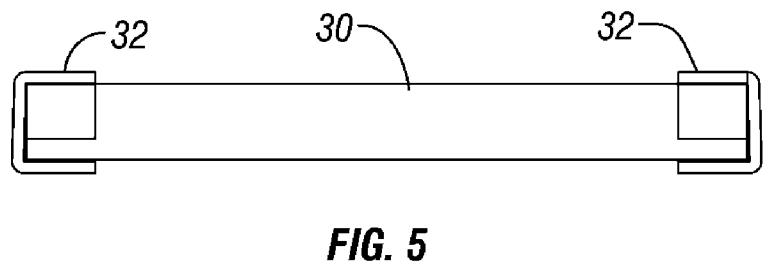
FIG. 5
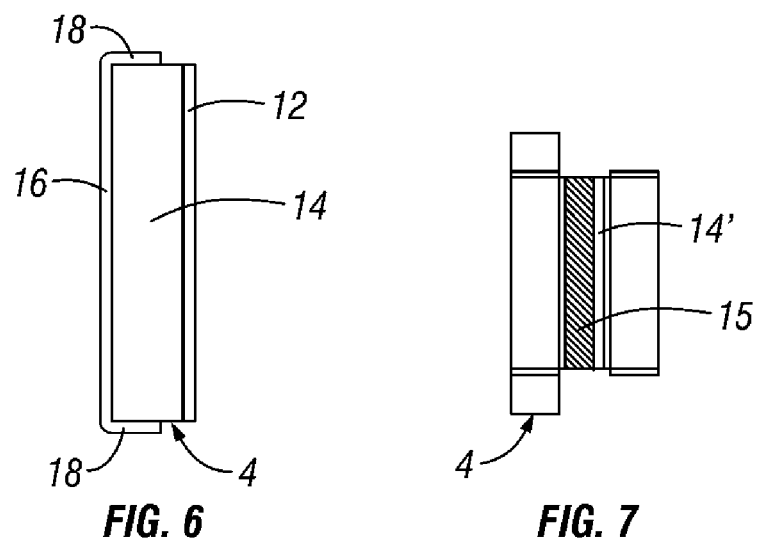
FIG. 6   FIG. 7

SURFACE MOUNTED CHIP RESISTOR WITH FLEXIBLE LEADS

FIELD OF THE INVENTION

The present invention relates to electronic passive components. More particularly, the present invention relates to a Surface Mounted (SM) chip resistor having a flat resistive pattern between two conducting termination pads. The invention also relates to a manufacturing method for transforming a surface mounted lead-less chip resistor into a component with flexible leads.

BACKGROUND OF THE INVENTION

SM resistors having flat resistive elements are produced in two main configurations—lead-less, and with leads. In the first configuration, the resistors are lead-less rectangular chips with termination pads for electrical connection at the two opposite ends of a resistive layer on top of a ceramic substrate.

The first configuration of SM resistor may have different termination configurations, including "Wrap Around Metallization" or "Flip Chip" configured termination. In chips with "Wrap Around Metallization", the pads extend from the termination pads over the short sides of the rectangular chip and to part of the chip's bottom. Soldering to a PCB is performed according to one of these two configurations of the terminations. For chips having pads on top only, a "Flip Chip" configuration, with pads down. For chips with "Wrap Around Metallization" the chip's metallized bottom is placed on the pads of the PCB.

The second configuration of a surface mount resistor is molded in a resin package with two flat leads attached to the termination pads, extending on two sides of the package, and bent to seat, for soldering, on the pads of a PCB.

The first configuration has the advantage of smaller dimensions and lower manufacturing costs, but has a limitation of failures of the solder joint to the PCB's pads when subjected to high mechanical and/or thermal stresses, the latter due to a mismatch of Coefficients of Thermal Expansion (CTE) between the chip's ceramic substrate and the PCB's material. The probability of such failure increases with the size of the chip.

Such stresses occur when the ambient temperature changes and the chip does not expand or contract at same rate as the PCB, or when a load applied to the resistor causes a rise of its temperature while the PCB remains cooler, or when the PCB is flexed causing a change of the distance between its pads. Thus, despite advances in the art, problems remain.

What is needed is a solution to failures of chip resistors caused by mechanical and thermal stresses after the chips are soldered to a Printed Circuit Board (PCB).

Therefore, it is a primary object, feature, or advantage of the present invention is to provide a low-cost method, suitable for mass production, of transforming lead-less chip resistors into devices with flexible leads without significant increase of their size.

BRIEF SUMMARY OF THE INVENTION

According to one aspect of the present invention a chip resistor is provided. The chip resistor includes a rigid insulated substrate having a top surface and an opposite bottom surface. There is a first electrically conductive termination pad and a second electrically conductive termination pad, both termination pads on the top surface of the rigid insulated substrate. There is also a layer of resistive material between the first and second electrically conductive termination pads. A first and a second flexible lead, each made of an electrically conductive metal is provided. The first flexible lead is attached and electrically connected to the first electrically conductive termination pad and the second flexible lead is attached and electrically connected to the second electrically conductive termination pad. Each of the flexible leads if formed from a plurality of lead sections for facilitating bending of each of the flexible leads around one of the ends of the chip resistor Each of the flexible leads is bent around one of the ends of the chip resistor.

According to another aspect of the present invention, a method for manufacturing a chip resistor with flexible leads from a leadless chip resistor is provided. The method includes providing a carrier strip with a lead-frame comprising a first and a second flexible lead, each flexible lead made of an electrically conductive metal and comprised of a plurality of lead sections, bending the first flexible lead and the second flexible lead around opposite ends of the leadless chip resistor, attaching the first flexible lead to a first termination pad of the leadless chip resistor, attaching the second flexible lead to a second termination pad of the leadless chip resistor, and separating the flexible leads from the carrier strip.

BRIEF DESCRIPTION OF THE DRAWINGS

FIG. 4 is a top view of an assembled chip with the flexible leads.

FIG. 5 is view of the long side of the same.

FIG. 6 is view of the short side of the same.

FIG. 7 shows an area of a section of a flexible lead coated with resin to prevent coverage by solder during assembly onto a PCB.

DETAILED DESCRIPTION OF THE PREFERRED EMBODIMENT

The present invention provides for attaching lead-frames to lead-less chip resistors in order to convert the lead-less chip resistors into chip resistors with flexible leads. The present invention provides a design of lead-frames and an assembly method suitable for automated mass production which enables the transformation of a finished lead-less resistor chip into a high reliability resistor with flexible leads for SM assembly onto a PCB.

Multiple embodiments are shown including an embodiment where a chip resistors is placed on a lead-frame with the termination pads up as well as an embodiment where the chip resistor is placed on a lead-frame with the termination pads down.

Figure 1:
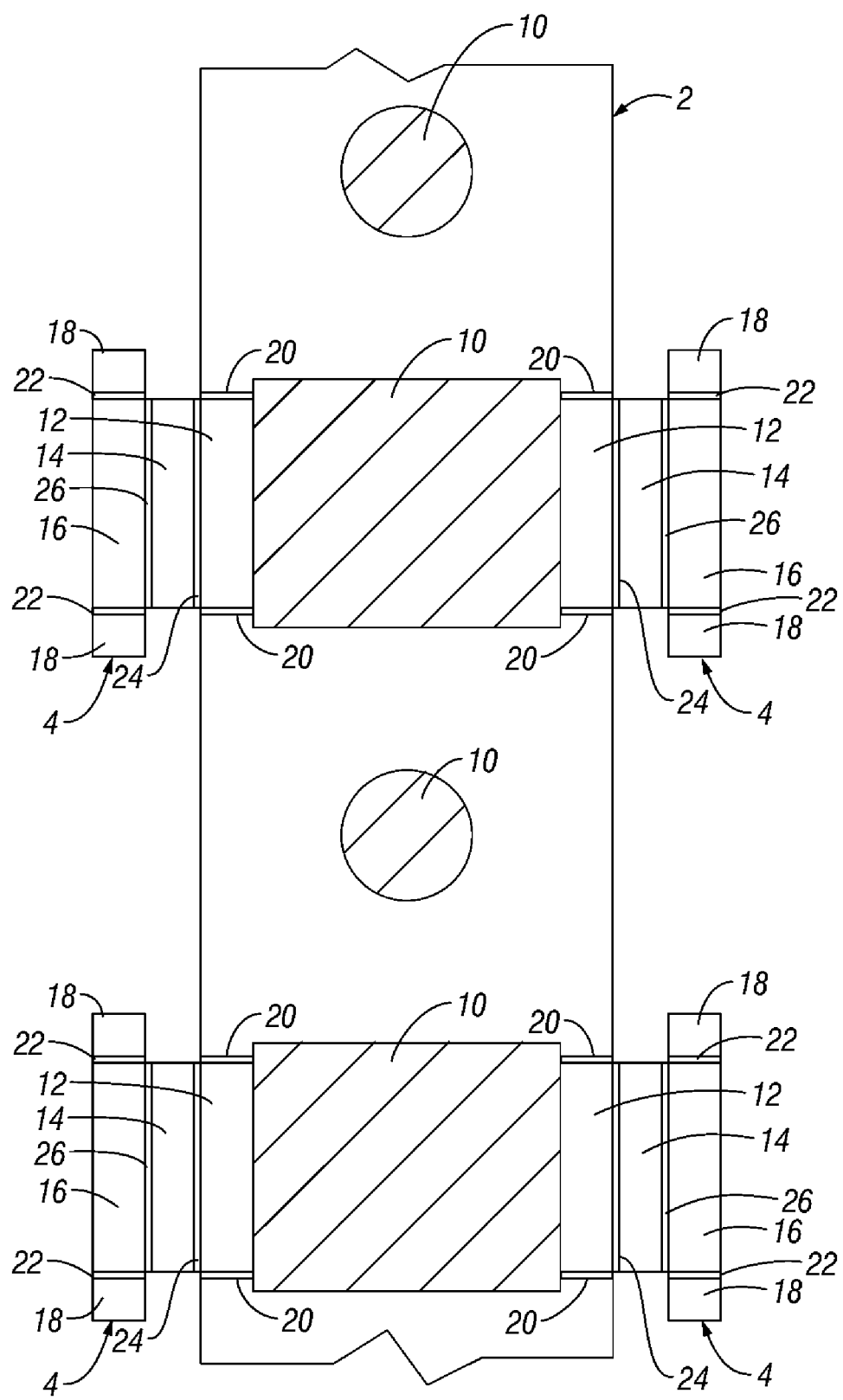
FIG. 1 is a drawing of a first version of a lead-frame used for manufacturing of the chip resistors with flexible leads. The lead-frame consists of a carrier strip with leads on its two sides.

In a first embodiment, the chip resistors are placed on a lead-frame with the termination pads up. FIG. 1 shows a lead-frame consisting of a central carrier strip 2 having punched out areas 10 and the flexible leads 4 on each side of the carrier strip 2. Each flexible lead 4 consists of multiple sections such as a first section 12, a second section 14, and a third section 16. Two flaps 18 are attached on opposite ends of the third section 16.

A first groove 20 is etched or stamped to facilitate separation of the assembled chips from the carrier strip 2. In addition, grooves are etched or stamped to facilitate the bending of the lead sections 12, 14, 16 around the resistor chip. A first groove 24 is between the first lead section 12 and the second lead section 14. A second groove 26 is between the second lead section 14 and a third lead section 16. Grooves 22 are also present between the third section 16 and its flaps 18.

Assembly is performed by placing a flip chip on the lead-frame, with the chip's termination pads up, on two sections 12, applying a solder paste on the pads and an adhesive such as glue to the flaps 18, bending the flaps 18 and sections 14 and section 16 to approach the chip's short sides and termination pads, and reflowing the solder paste and curing the adhesive or glue. The mechanical attachment of the flexible leads to the chip, in addition to the solder joint, to the termination pad, is enhanced by cementing the flaps 18 to the chip.

Commonly used epoxy-glass PCB have a coefficient of thermal expansion (CTE) much higher than the CTE of a ceramic or similar substrate of the resistor chip. The mounting of chips onto the PCB requires a high temperature for re-flowing the solder, and it is followed by cooling after solder's solidification. As a result, the PCB contracts more than the chip introducing a thermal strain. The bottom section 16 of the flexible leads follows this movement of PCB's contraction thus avoiding a dangerous stress in the solder joint. Similarly, when the chip resistor heats up due to an applied load, it expands while the PCB is still cold and again it causes a bending of the leads without stressing the solder joint. The mechanical attachment of the flexible leads 4 to the chip, in addition to the solder joint with the termination pad, is enhanced by the flaps 18 cemented to the chip. The flaps 18 take up a shear stress as a result of these thermal strains and stresses which assures a high degree of the assembly's robustness.

Figure 2:
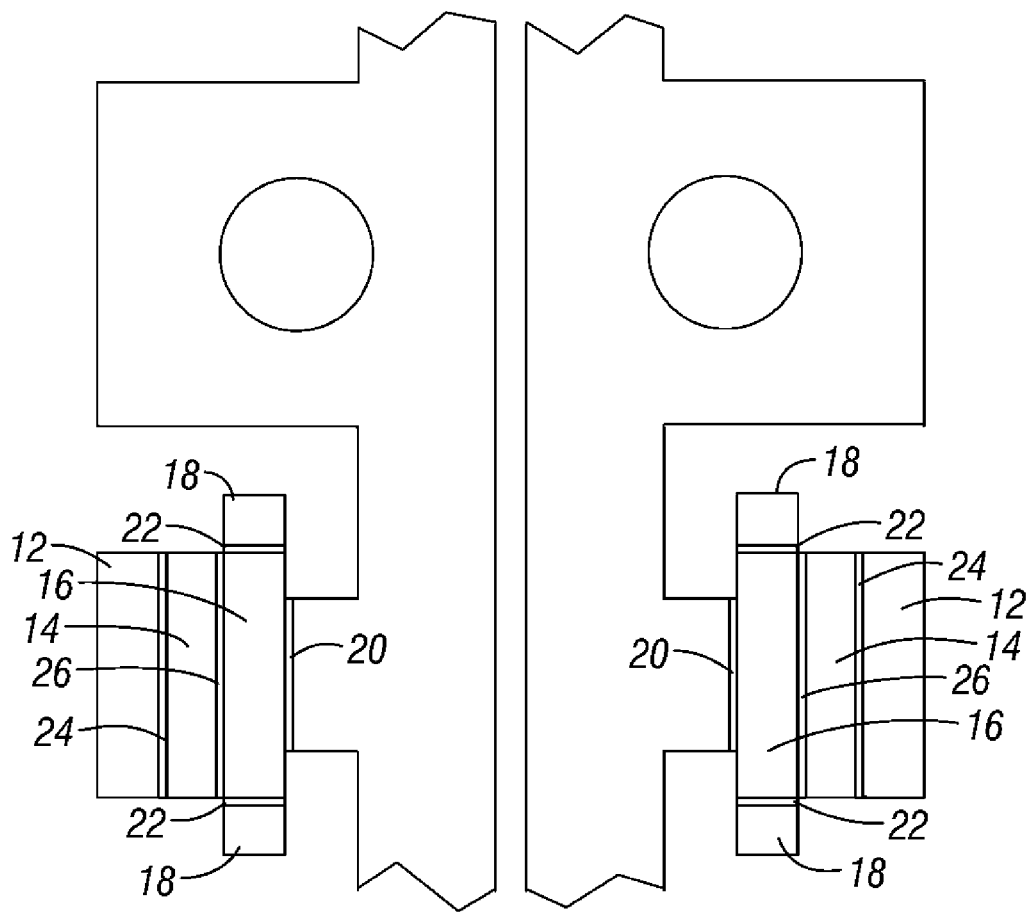
FIG. 2 is a drawing of a second version consisting of a lead-frame split into two identical half lead-frames.
Figure 3:
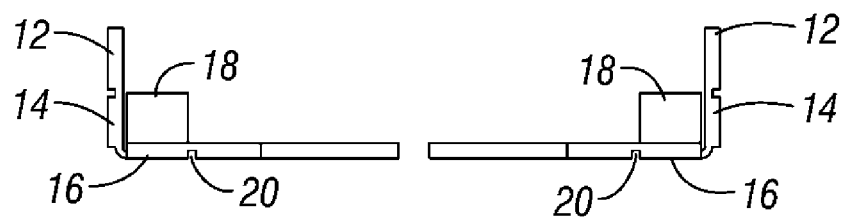
FIG. 3 shows a profile of the lead-frame per FIG. 2 after its sections are partially bent to form a nest for placing the resistor chip.
Figure 8:
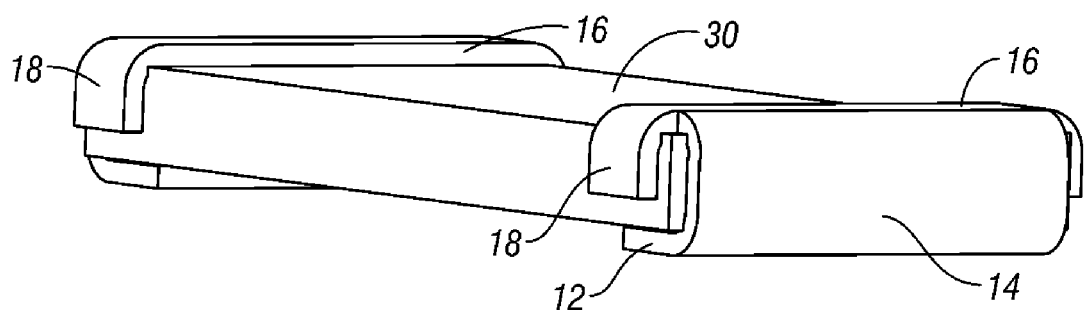
FIG. 8 illustrates a perspective of one embodiment of an assembled chip with flexible leads.

FIG. 2 and FIG. 3 illustrate another embodiment. In the embodiment shown in FIG. 2 and FIG. 3, two opposite half lead-frames are used. FIG. 2 is a plan view. FIG. 3 is a profile, after partial bending. In this embodiment flaps 18 and section 14 are first bent as shown in FIG. 3 to form a nest for placing the flip chips. Then, solder paste and glue are applied to the nest. The chips are then placed face down with their terminal pads on sections 16. After the reflowing the solder paste and curing the glue the carrier strip of one half-frame can be bent along the grooves 20 and cut off to allow automated electrical measurement of individual chips and, if required, final trimming of their resistance to a very precise ohmic value.

An alternative method consists of using chips with gold plated pads, a tin plated lead-frame and achieve the electrical interconnection by parallel-gap welding.

FIGS. 4, 5 and 6 show a plan view and profiles of an assembled chip resistor with flexible leads. A chip 30 includes termination pads 32, lead sections 12, 14 and 16 and flaps 18.

FIG. 7 shows a protective resin layer 14' which is applied on both sides of section 14 before assembly. The resin prevents, during soldering to a PCB, the creeping of the solder up the plates 18 which would reduce its flexibility.

The process described above can also be applied to leadless chip resistors with wrap-around metallization after these chips are covered, up to about half of their thickness, with a protective layer preventing the solder to creep up the leads during the assembly on a PCB. This can be achieved by dipping the chips to about half their thickness into a liquid thermosetting resin and curing the resin.

Thus, the present invention provides for transforming a leadless chip resistor into one with flexible leads. The lead-frames containing the flexible leads are designed in a way to enable alternative production methods, including reel to reel automated assembly for mass production or the use of strips of lead-frame for hand processing of small batches of chips.

Therefore various embodiments for providing a method of transforming lead-less chip resistors into devices with flexible leads have been provided. The present invention contemplates variations in the structure of the lead frame, the manner in which the lead frame is attached, and other variations within the spirit and scope of the invention.

What is claimed is:

1. A chip resistor having first and second ends for mounting to a printed circuit board (PCB), the chip resistor comprising:
   a rigid insulated substrate having a top surface, bottom surface and first and second ends;
   a first electrically conductive termination pad and a second electrically conductive termination pad;
   a layer of resistive material between the first and second electrically conductive termination pads;
   a first and second flexible lead, each made of an electrically conductive metal;
   the first flexible lead attached and electrically connected to the first electrically conductive termination pad and the second flexible lead attached and electrically connected to the second electrically conductive termination pad;
   wherein each of the flexible leads are electrically connected to the resistive material on the top surface of the substrate but not connected to the bottom surface of the substrate and wherein a gap is formed between the flexible leads and the ends of the substrate to allow for contraction of the PCB when cooled after soldering the lead to the pad on the PCB.

2. The chip resistor of claim 1 wherein the first and second flexible lead each include a first lead section, a second lead section and a third section and wherein a first groove is located between the first lead section and the second lead section and wherein a second groove is located between the second lead section and the third lead section.

3. The chip resistor of claim 2 wherein the second lead section is coated with a resin.

4. The chip resistor of claim 2 further comprising first and second flaps extending from each first lead section.

5. The chip resistor of claim 4 wherein the first and second flaps are bent down to and cemented to the insulated substrate.

6. The chip resistor of claim 1 wherein the flexible leads are comprised of a plurality of lead sections for facilitating bending of each of the flexible leads around one of the ends of the substrate.

7. The chip resistor of claim 1 wherein at least one of the flexible lead sections includes a protective coating to avoid creeping of liquid solder up the lead when the chip resistor is soldered to the PCB.

8. The chip resistor of claim 1 further comprising a wrap around metallization for each of the termination pads wherein a resin covers a portion of the wrap around metallization.

9. A method for manufacturing a chip resistor with the flexible leads from a leadless chip resistor for mounting to a printed circuit board (PCB), the method comprising:
   providing a carrier strip with a lead-frame comprising a first and second flexible lead, each flexible lead made of an electrically conductive metal;
   providing a leadless chip resistor including first and second termination pads and first and second ends;
   bending the first flexible lead and the second flexible lead around the ends of the leadless chip resistor;

attaching the first flexible lead to the first termination pad, forming a first gap between the first flexible lead and the first end of the leadless chip resistor;

attaching the second flexible lead to the second termination pad, forming a second gap between the second flexible lead and a second end of the leadless chip resistor;

wherein the first and second gaps allow for contraction of the PCB when cooled after soldering the first and second flexible leads to the PCB; and separating the first flexible lead and the second flexible lead from the carrier strip.

10. The method of claim 9 wherein each of the flexible leads includes flaps and wherein the method further comprises attaching the flaps to the leadless chip resistor.

11. The method of claim 10 wherein the attaching of the flaps to the leadless chip resistor comprises cementing the flaps to the leadless chip resistor.

12. The method of claim 9 wherein the attaching of the first flexible lead and the attaching of the second flexible lead are performed using soldering.

13. The method of claim 9 wherein the attaching the first flexible lead and the attaching the second flexible lead are performed using welding.

14. The chip resistor of claim 1 wherein the flexible leads are attached to the substrate by a resin wherein the resin leaves a gap between the bottom surface of the substrate and the flexible lead.

15. A chip resistor having first and second ends comprising:
- a rigid insulated substrate having a top surface and a bottom surface;
- a first electrically conductive termination pad and a second electrically conductive termination pad;
- a layer of resistive material between the first and second electrically conductive termination pads;
- a first and second flexible lead, each made of an electrically conductive metal, the first and second flexible lead each including a first lead section, a second lead section and a third section;
- first and second flaps extending from each first lead section;
- the first flexible lead attached and electrically connected to the first electrically conductive termination pad and the second flexible lead attached and electrically connected to the second electrically conductive termination pad;
- wherein each of the flexible leads are electrically connected to the resistive material on the top surface of the substrate but not connected to the bottom surface of the substrate.

16. The chip resistor of claim 15 further comprising a first groove formed between the first lead section and the second lead section and a second groove formed between the second lead section and the third lead section.

17. The chip resistor of claim 15 wherein the second lead section is coated with a resin.

18. A method for manufacturing a chip resistor with the flexible leads from a leadless chip resistor comprising:
- providing a carrier strip with a lead-frame comprising a first and second flexible lead, each flexible lead made of an electrically conductive metal;
- providing a leadless chip resistor including first and second termination pads and first and second ends;
- bending the first and second flexible lead around the ends of the leadless chip resistor, each flexible lead including a first lead section, a second lead section and a third section and first and second flaps extending from the first lead section;
- attaching the first flexible lead to the first termination pad;
- attaching the second flexible lead to the second termination pad;
- attaching the first and second flaps to the leadless chip resistor; and
- separating the first flexible lead and the second flexible lead from the carrier strip.

19. The method of claim 18 further comprising, forming a first groove between the first lead section and the second lead section and forming a second groove between the second lead section and the third lead section.

20. The method of claim 18 further comprising, coating the second lead section with a resin.

* * * * *